(12) United States Patent
Huh et al.

(10) Patent No.: US 8,013,325 B2
(45) Date of Patent: Sep. 6, 2011

(54) THIN FILM TRANSISTOR, ORGANIC LIGHT EMITTING DEVICE INCLUDING THIN FILM TRANSISTOR, AND MANUFACTURING METHOD THEREOF

(75) Inventors: Jong-Moo Huh, Gyeonggi-do (KR); Kyu-Sik Cho, Suwon-si (KR); Kunal Girotra, Suwon-si (KR); Joo-Hoo Choi, Seoul (KR); Byoung-June Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 447 days.

(21) Appl. No.: 11/770,171

(22) Filed: Jun. 28, 2007

(65) Prior Publication Data
US 2008/0246033 A1 Oct. 9, 2008

(30) Foreign Application Priority Data
Apr. 4, 2007 (KR) .......... 10-2007-0033244

(51) Int. Cl.
H01L 35/24 (2006.01)
H01L 51/00 (2006.01)

(52) U.S. Cl. ....... 257/40; 257/59; 257/72; 257/E27.001; 257/E27.116; 257/E27.117; 349/43; 313/483; 315/32

(58) Field of Classification Search .......... 257/40, 257/59, 72, E27.001, E27.116, E27.117, 257/347, E29.151; 349/43; 313/483; 315/32
See application file for complete search history.

(56) References Cited

U.S. PATENT DOCUMENTS
2006/0044232 A1* 3/2006 Choi et al. ............ 345/76

FOREIGN PATENT DOCUMENTS
| KR | 19990009762 | 2/1999 |
| KR | 1020000009311 | 2/2000 |
| KR | 1020030085894 | 11/2003 |
| KR | 1020060077178 | 7/2006 |

OTHER PUBLICATIONS
Machine Translation of KR 10-2000-0009311.*

* cited by examiner

*Primary Examiner* — Eugene Lee
*Assistant Examiner* — Anthony Ho
(74) *Attorney, Agent, or Firm* — Cantor Colburn LLP

(57) ABSTRACT

The present invention relates to a thin film transistor, a method thereof and an organic light emitting device including the thin film transistor. According to an embodiment of the present invention, the thin film transistor includes a substrate, a control electrode, an insulating layer, a first electrode and a second electrode, a first ohmic contact layer and a second ohmic contact layer, and a semiconductor layer. The control electrode is formed on the substrate, and the insulating layer is formed on the control electrode. The first and the second electrodes are formed on the insulating layer. The first ohmic contact layer and the second ohmic contact layer are formed on the first electrode and the second electrode. The semiconductor layer is formed on the first ohmic contact layer and the second ohmic contact layer to fill between the first and the second electrodes.

11 Claims, 16 Drawing Sheets

THIN FILM TRANSISTOR, ORGANIC LIGHT EMITTING DEVICE INCLUDING THIN FILM TRANSISTOR, AND MANUFACTURING METHOD THEREOF

This application claims priority to Korean Patent Application No. 10-2007-0033244, filed on Apr. 4, 2007, the disclosure of which is hereby incorporated herein by reference in its entirety for all purposes.

BACKGROUND OF THE INVENTION (a) Field of the Invention

The present invention relates to a thin film transistor, an organic light emitting display (OLED) device including the thin film transistor, and a manufacturing method of the same.

(b) Description of the Related Art

An active matrix flat panel display generally includes a plurality of pixels arranged in a matrix and displays images by controlling the luminance of the pixels based on luminance information indicative of a desired image. One type of active matrix flat panel display is an organic light emitting display (OLED).

An OLED is self-emissive. OLEDs have desirable characteristics such as a relatively wide viewing angle, a relatively fast response time, and a relatively high contrast ratio when compared to liquid crystal displays (LCDs). Further, because an OLED does not require a backlight assembly, OLEDs are lighter and consume less power than LCDs.

A pixel of an OLED includes a light emitting element, a driving transistor, and a switching transistor. The transistors can be a thin film transistor (TFT). The active layer of the TFT can be formed of polysilicon or amorphous silicon.

While the deposition temperature of the amorphous silicon is low and it is convenient for manufacturing TFTs, the electron mobility thereof is low and the amorphous silicon TFT doesn't provide a sufficient driving current. Also the threshold voltage of the amorphous silicon TFT easily shifts over time.

While the electron mobility of the polysilicon TFT is high, off current thereof is high such that crosstalk may occur.

In the case of the polysilicon TFT, the polysilicon is generally formed on a substrate, and an ohmic contact layer, a gate insulating layer, and a gate electrode are formed sequentially.

BRIEF SUMMARY OF THE INVENTION

In a general structure of a polysilicon TFT, channels formed on the polysilicon layer can be damaged when the ohmic contact layer is patterned. Also, the channels can be etched unintentionally to cause non-uniform thickness of channels, thereby causing non-uniform characteristic of TFTs.

Embodiments of the present invention provide a TFT capable of reducing damage of the channel and improving uniformity of the TFT. According to exemplary embodiments of the present invention, a thin film transistor includes a substrate, a control electrode formed on the substrate, an insulating layer formed on the control electrode, a first electrode and a second electrode spaced apart from each other with respect to the control electrode and formed on the insulating layer, a first ohmic contact layer and a second ohmic contact layer formed on the first electrode and the second electrode, and a semiconductor layer formed on the first ohmic contact layer and the second ohmic contact layer to fill between the first electrode and the second electrode.

The first ohmic contact and the second ohmic contact layers cover the opposite side surfaces of the first and the second electrodes.

The semiconductor layer includes amorphous silicon, microcrystalline silicon, or polysilicon.

According to another embodiment of the present invention, a thin film transistor includes a first electrode and a second electrode spaced apart from each other, a first ohmic contact layer and a second ohmic contact layer formed on the first electrode and the second electrode to cover the opposite side surfaces thereof, a semiconductor layer formed on the first ohmic contact layer and the second ohmic contact layer to fill between the first electrode and the second electrode, a control electrode formed in the area corresponding to the semiconductor layer, and an insulating layer formed between the semiconductor and the control electrode.

The insulating layer can be formed on the control electrode or the semiconductor layer.

According to another embodiment of the present invention, a method of manufacturing a thin film transistor includes forming a control electrode on a substrate, forming a first electrode and a second electrode on the control electrode, forming a first ohmic contact layer and a second ohmic contact layer on the first electrode and the second electrode, and forming a semiconductor layer on the first ohmic contact layer and the second ohmic contact layer to fill between the first electrode and the second electrode.

The forming of the semiconductor layer includes forming an amorphous silicon layer, forming a metal catalyst layer on the amorphous silicon layer, heating the amorphous silicon layer and the metal catalyst layer to form a microcrystalline silicon, patterning the microcrystalline silicon and the metal catalyst layer, and removing the metal catalyst layer on the patterned microcrystalline silicon.

The metal catalyst layer includes nickel.

According to another embodiment of the present invention, an organic light emitting device includes a substrate, a driving transistor, a pixel electrode, an organic light emitting member and a counter electrode.

The driving transistor includes a first control electrode formed on the substrate, an insulating layer formed on the first control electrode and the substrate, a first electrode and a second electrode spaced apart from each other with respect to the first control electrode and formed on the insulating layer, a first ohmic contact layer and a second ohmic contact layer formed on the first and the second electrodes, a first semiconductor layer formed on the first ohmic contact layer and the second ohmic contact layer to fill the first electrode and the second electrode.

The pixel is connected to the second electrode. The organic light emitting member is formed on the pixel electrode, and the counter electrode is formed on the organic light emitting member.

BRIEF DESCRIPTION OF THE DRAWINGS

The present invention will become more apparent by describing exemplary and preferred embodiments thereof in detail with reference to the accompanying drawings, in which.

Use of the same reference symbols in different figures indicates similar or identical items.

DETAILED DESCRIPTION OF THE INVENTION

An OLED according to an exemplary embodiment of the present invention will be described with reference to FIG. 1.

Figure 1:
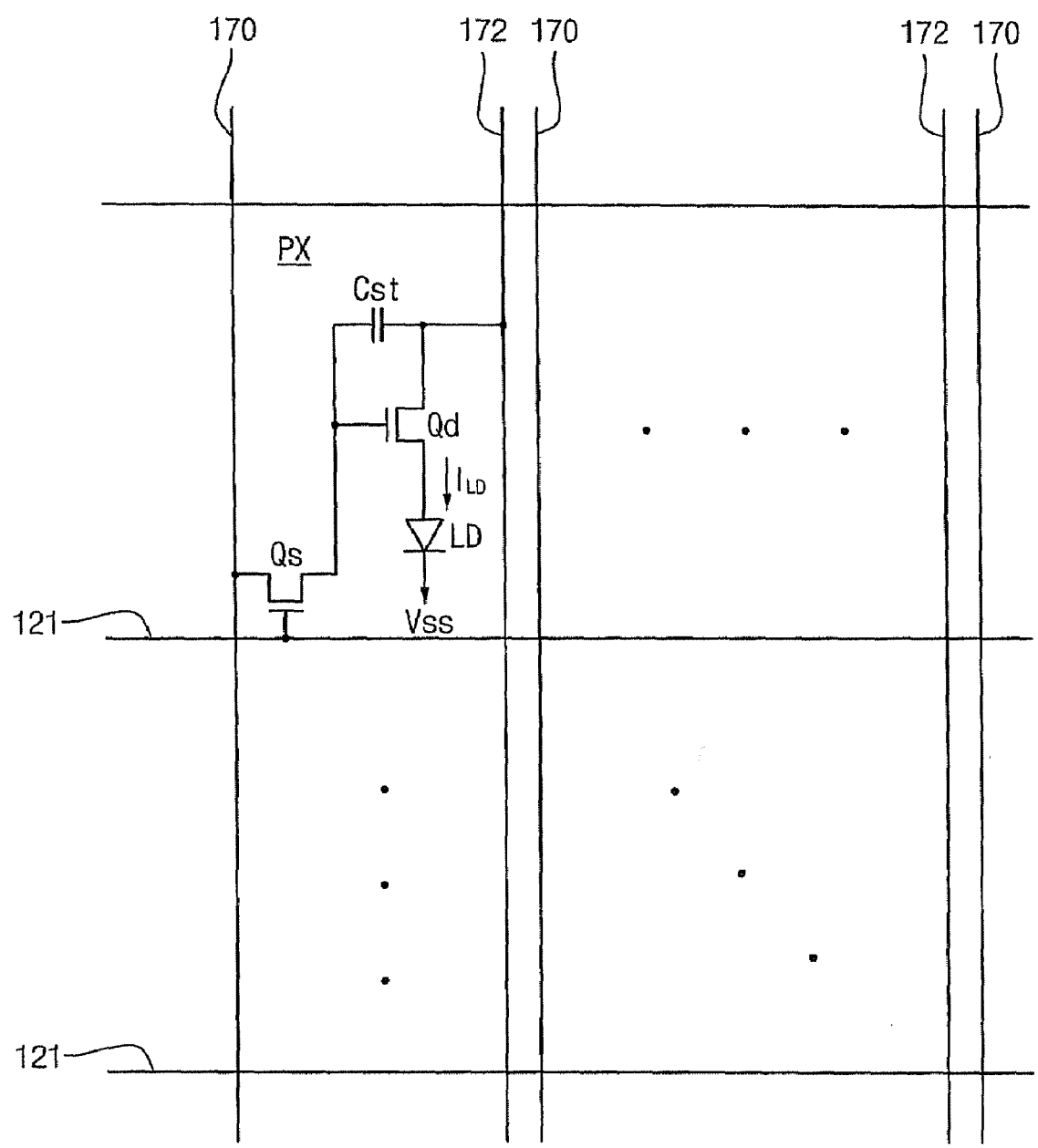
FIG. 1 is an equivalent circuit diagram of an exemplary OLED according to an exemplary embodiment of the present invention.

FIG. 1 is an equivalent circuit diagram of an exemplary OLED according to an exemplary embodiment of the present invention.

Referring to FIG. 1, an OLED according to an exemplary embodiment of the present invention includes a plurality of signal lines 121, 170, and 172 and a plurality of pixels PX connected thereto and arranged substantially in a matrix.

The signal lines include a plurality of gate lines 121 for transmitting gate signals (or scanning signals), a plurality of data lines 170 for transmitting data signals, and a plurality of driving voltage lines 172 for transmitting a driving voltage. The gate lines 121 extend substantially in a row direction and substantially parallel to each other. The data lines 170 and the driving voltage lines extend substantially in a column direction and substantially parallel to each other. Alternatively, the driving voltage lines 172 may extend substantially in the row direction substantially parallel to the gate lines 121.

Each pixel PX includes a switching transistor Qs, a driving transistor Qd, a storage capacitor Cst, and an organic light emitting element LD.

The switching transistor Qs such as a thin film transistor ("TFT") has a control terminal, such as a gate electrode, an input terminal, such as a source electrode, and an output terminal, such as a drain electrode. The control terminal is connected to one of the gate lines 121, the input terminal is connected to one of the data lines 170, and the output terminal is connected to the driving transistor Qd. The switching transistor Qs transmits the data signals applied to the data line 170 to the driving transistor Qd in response to the gate signal applied to the gate line 121.

The driving transistor Qd such as a TFT has a control terminal, such as a gate electrode, an input terminal, such as a source electrode, and an output terminal, such as a drain electrode, and an organic light emitting element LD. The control terminal is connected to the output terminal of the switching transistor Qs. The input terminal is connected to the driving voltage line 172, and the output terminal is connected to the organic light emitting element LD. The driving transistor Qd drives an output current $I_{LD}$ having a magnitude depending on the voltage between the control terminal and the output terminal thereof.

The storage capacitor Cst is connected between the control terminal and the input terminal of the driving transistor Qd. The storage capacitor Cst stores the data signal applied to the control terminal of the driving transistor Qd from the switching transistor Qs and maintains the data signal after the switching transistor Qd turns off.

The organic light emitting element LD has an anode connected to the output terminal of the driving transistor Qd and a cathode connected to a common voltage Vss. The organic light emitting element LD emits light having an intensity depending on an output current $I_{LD}$ of the driving transistor Qd, thereby displaying images.

The switching transistor Qs and the driving transistor Qd may be n-channel field effect transistors ("FETs"). However, at least one of the switching transistor Qs and the driving transistor Qd may be a p-channel FET. In addition, the connections among the transistors Qs and Qd, the storage capacitor Cst, and the organic light emitting element LD may be modified.

The exemplary OLED shown in FIG. 1 will be described in detail with reference to FIGS. 2 and 3.

Figure 2:
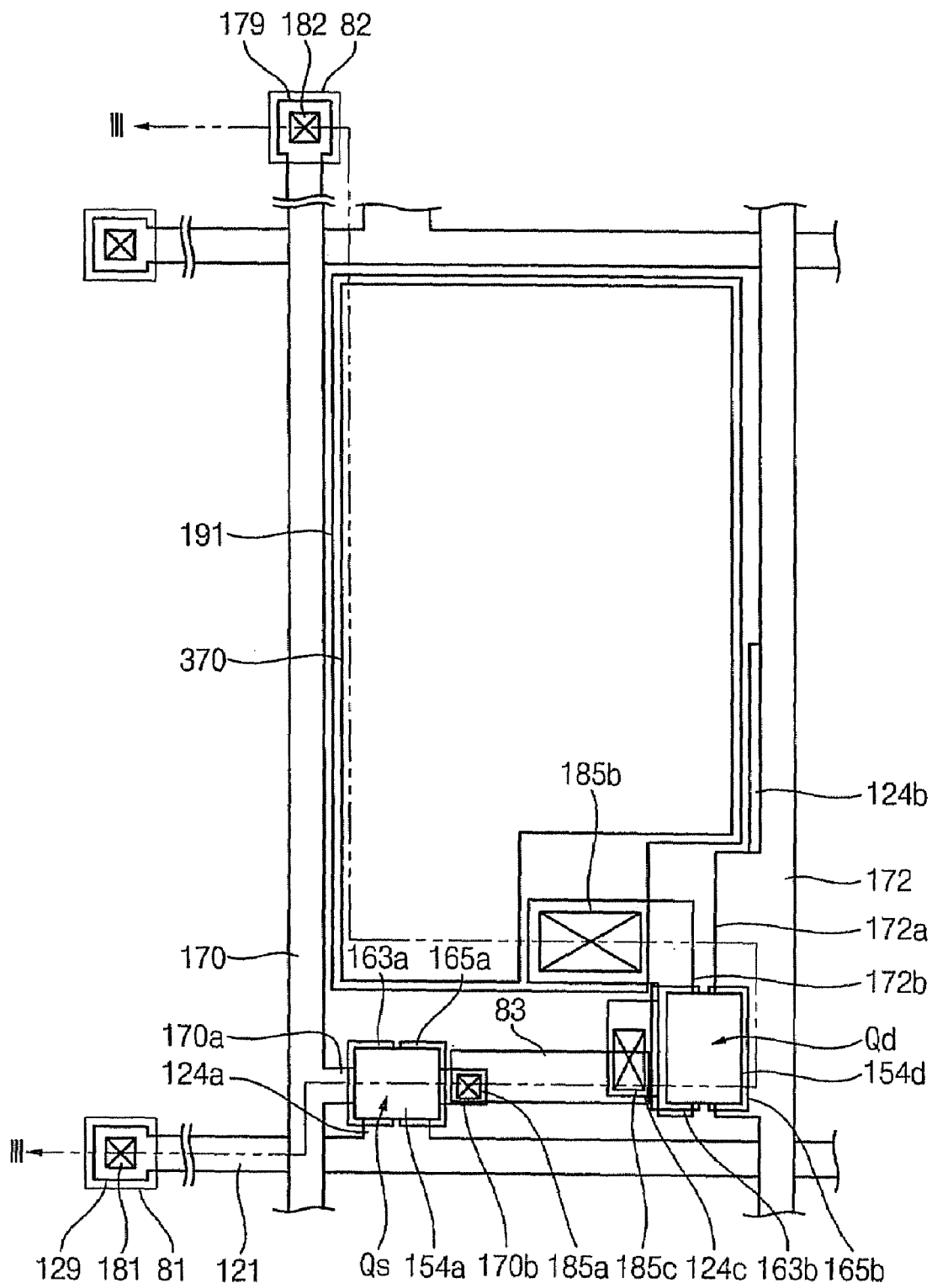
FIG. 2 is a layout view of an embodiment of an exemplary OLED.
Figure 3:
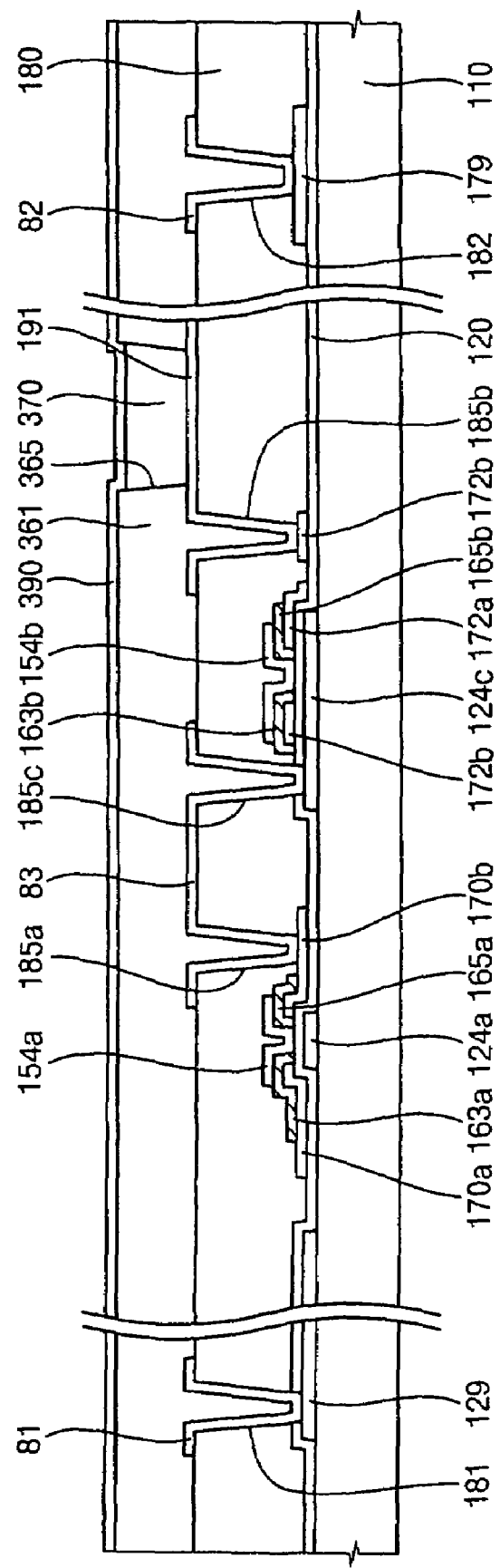
FIG. 3 is a cross-sectional view of the exemplary OLED shown in FIG. 2 taken along line III-III.

FIG. 2 is a layout view of an exemplary OLED according to an exemplary embodiment of the present invention, and FIG. 3 is a cross-sectional view of the exemplary OLED shown in FIG. 2 taken along line II-II.

A plurality of gate lines 121, a plurality of first control electrodes 124a, a plurality of second control electrode 124c, and a plurality of capacitor electrode 124b are formed on a substrate 110 made of a material such as, but not limited to, transparent glass or plastic.

The gate lines 121 extend in a horizontal direction and transmit gate signals. Each gate line 121 includes an end portion 129 having a large area for contact with another layer or an external driving circuit. When gate driving circuits (not shown) are integrated on the substrate 110, the gate lines 121 can be connected directly to the gate driving circuits. The first control electrode 124a is connected to the associated gate line 121.

The second control electrode 124c is separated from the associated gate line 121 and disposed between the gate lines 121. The capacitor electrode 124b protrudes upward from the second control electrode 124c extending in a longitudinal direction.

The first control electrodes 124a, the gate lines 121, and the second control electrodes 124c are made of an aluminum (Al)-based metal such as Al and an Al alloy, a silver (Ag)-based metal such as Ag and a Ag alloy, a copper (Cu)-based metal such as Cu and a Cu alloy, a molybdenum (Mo)-based metal such as Mo and a Mo alloy, chromium (Cr), tantalum (Ta), titanium (Ti), etc. The first control electrodes 124a, the gate lines 121, and the second control electrodes 124c may have a multi-layered structure including two films having different physical characteristics. One film is a metal having low resistivity such as an Al-based metal, Ag-based metal, or Cu-based metal for reducing a signal delay or a voltage drop. Another is a metal such as a Mo-based metal, Cr, Ti, or Ta having a good physical, chemical and electrical contact characteristic with other materials such as indium tin oxide (ITO) or indium zinc oxide (IZO). An exemplary combination of the lower film material and the upper film material is Al or AlNd alloy and Mo, respectively. The lower and the upper film materials may be changed relative to each other.

An insulating layer 120 made of silicon oxide (SiOx) or silicon nitride (SiNx) is formed on the first control electrodes 124a, the gate lines 121 and the second control electrode 124c.

A plurality of data lines 170, a plurality of first input electrodes 170a, a plurality of first output electrodes 170b, a plurality of driving voltage lines 172, a plurality of second input electrodes 172a, and a plurality of second output electrodes 172b are formed on the insulating layer 120.

The data lines 170 transmit data signals and extend in a longitudinal direction across the gate lines 121. Each data line 170 includes an end portion 179 having a large area which contacts another layer or an external driving circuit. When data driving circuits (not shown) are integrated on the substrate 110, the data lines 170 can be connected directly to the data driving circuits. The data line 170 protrudes toward the associated first control electrode 124a to form the first input electrode 170a.

The first output electrode 170b is separated from the data line 170. The first input electrode 170a and the first output electrode 170b are spaced apart from each other with respect to the first control electrode 124a.

The driving voltage lines 172 transmit driving voltages and extend in a longitudinal direction. Each driving voltage line 172 is disposed adjacent to and parallel to the associated data line 170. The second input electrodes 172a protrude from the associated driving voltage lines 172 toward the second control electrodes 124c.

The second output electrode 172b is apart from the driving voltage line 172 and faces the second input electrode 172a. The second input electrode 172a and the second output electrode 172b are spaced apart from each other with respect to the second control electrode 172.

The data lines 170, the input electrode 170a, the first output electrode 170b, the driving voltage line 172, the second input electrode 172a and the second output electrode 172b are formed of refractory metal such as molybdenum (Mo), Cr, Ta, and Ti, or alloys thereof. The data lines 170, the first output electrode 170b, the driving voltage line 172 and the second output electrode 172b may have a multi-layered structure including a refractory metal film and a low resistivity conductive film. An exemplary combination of the multi-layered structure is a lower film of Cr or Mo and an upper film of an Al based metal, or a lower film of a Mo based metal, an intermediate film of an Al based metal, and an upper film of a Mo based metal. The driving voltage line 172 and the second output electrode 172b can be made of various metals or conductive materials.

A plurality of first and second ohmic contacts 163a and 165a and a plurality of third and fourth ohmic contacts 163b and 165b are formed on the first input electrodes 170a, the first output electrodes 170b, the second input electrodes 172a, and the second output electrodes 172b respectively. The ohmic contacts 163a, 165a, 163b, and 165b are apart from one another and formed of silicide or n+hydrogenated amorphous silicon doped with an n-type impurity such as phosphorous.

The first ohmic contact 163a and the second ohmic contact 165a cover the opposite side surfaces of the first input electrode 170a and the first output electrode 170b.

The third and the fourth ohmic contact 163b and 165b cover the opposite side surfaces of the second input electrode 172a and the second output electrode 172b.

In another embodiment, the first and the second ohmic contacts 163a and 165a have substantially the same shape as the first input electrode 170a and the first output electrode 170b respectively. The third and the fourth ohmic contacts 163b and 165b have substantially the same shape as the second input electrode 172a and the second output electrode 172b.

First semiconductor layers 154a and second semiconductor layers 154b are formed on the ohmic contact 163a, 165a, 163b, and 165b and a portion of the insulating layer 120 therebetween. The first semiconductor 154a is formed on the first and the second ohmic contacts 163a and 165a with filling between the first input electrode 170a and the first output electrode 170b. The second semiconductor 154b is formed on the third and the fourth ohmic contacts 163b and 165b with filling between the second input electrode 172a and the second output electrode 172b.

The first and the second semiconductor layers 154a and 154b are formed of amorphous silicon, microcrystalline silicon, or polysilicon and cover a portion of the ohmic contacts 163a, 165a, 163b, and 165b.

The first control electrode 124a, the first input electrode 170a and the first output electrode 170b forms the switching transistor Qs with the first semiconductor layer 154a. The channel of the switching TFT is formed on the first semiconductor layer 154a between the first input electrode 170a and the first output electrode 170b.

The second control electrode 124c, the second input electrode 172a, and the second output electrode 172b form the driving transistor Qd with the second semiconductor layer 154b.

The first and the second ohmic contact 163a and 165a cover the opposite sides of the first input electrode 170a and the first output electrode 170b and prevent the first semiconductor layer 154a from contacting the first input electrode 170a and the first output electrode 170b, thereby reducing off current of the switching transistor Qs. Also, the third and the fourth ohmic contact 163b and 165b cover the opposite sides of the second input electrode 172a and the second output electrode 172b and prevent the second semiconductor layer 154b from contacting the second input electrode 172a and the second output electrode 172b, thereby reducing off current of the driving transistor Qd.

A passivation layer 180 is formed on the first and the second semiconductor layer 154a and 154b. The passivation layer 180 is formed of inorganic material such as silicon oxide and silicon nitride, or double-layered structure of inorganic material and organic material. Also, the passivation layer 180 can be a photosensitive organic material having a good flatness characteristic, or a dielectric insulating material having dielectric constant lower than 4.0.

The passivation layer 180 has a plurality of contact holes 182 exposing the end portions 179 of the data lines 170, and a plurality of contact holes 185a and 185b exposing the first output electrode 170b and the second output electrode 172b.

The passivation layer 180 and the insulating layer 120 have a plurality of contact holes 181 exposing the end portion 120 of the gate lines 121, and a plurality of contact holes 185c exposing the second control electrode 124c.

A plurality of pixel electrodes 191, a plurality of connection members 83 and a plurality of contact assistants 81 and 82 are formed on the passivation layer 180. The pixel electrodes 191, the connection members 83 and the contact assistants 81 and 82 are formed of transparent conductive material such as ITO, IZO, and amorphous ITO, or metal such as calcium (Ca), barium (Ba), magnesium (Mg), aluminum (Al), and silver (Ag).

The pixel electrode 191 is connected to the second output electrode 172b through the contact hole 185b. The connection member 83 is connected to the first output electrode 170b and the second control electrode 124c through the contact holes 185a and 185c.

The contact assistants 81 and 82 are connected to the end portion 120 of the gate line 121 and the end portion 179 of the data line 170 through the contact holes 181 and 182 respectively. The contact assistants 81 and 82 protect the end portions 129 and 179 and compensate the adherence with external devices.

A partition 361 is formed on the pixel electrodes 191, the connection members 83, the contact assistants 81 and 82, and the exposed surface of the passivation layer 180. The partition 361 has openings 365 to expose the pixel electrodes 191. The partition 361 is formed of organic or inorganic material. In another embodiment, the partition 361 can be made of photosensitive material having black pigment to function as a light blocking member.

A plurality of organic light emitting members 370 are formed on the pixel electrode 191 and confined in the opening 365 defined by the partition 361.

Each of the organic light emitting members 370 may have a multi-layered structure including an emitting layer (not shown) for emitting light and auxiliary layers (not shown) for improving the efficiency of light emission of the emitting layer.

The light emitting layers are preferably made of a high molecular weight compound, a low molecular weight compound, or mixtures thereof each uniquely emitting one color from a set of color lights such as primary color lights, such as red, green, and blue.

The OLED displays images by spatially adding the monochromatic color lights emitted from the light emitting layers.

Alternatively, light emitting layers for red, green, and blue may be perpendicularly or horizontally formed in each pixel PX, to form white light emitting layers. In another embodiment, color filters representing red, green, and blue may be formed on or under white light emitting layers to display desired colors.

The auxiliary layers may include an electron transport layer (not shown) and a hole transport layer (not shown) for improving the balance of the electrons and holes, and an electron injecting layer (not shown) and a hole injecting layer (not shown) for improving the injection of the electron and holes. The auxiliary layers may include one or more of the layers.

A common electrode 370 is formed on the organic light emitting member 370 and the partition 361. The common electrode 370 is applied with a common voltage Vss and formed of a metal such as Ca, Ba, Mg, Al, and Ag, or transparent conductive material such as ITO and IZO.

The pixel electrode 191, the organic light emitting member 370, and the common electrode 270 form an organic light emitting element LD. The pixel electrode 191 can be an anode and the common electrode 270 a cathode, or vice versa.

The OLED is divided into a top emission type and a bottom emission type depending on the direction of light emission. In a top emission type, the pixel electrode 191 is opaque, and the common electrode 390 is transparent, thereby transmitting the light to the common electrode 390. In a bottom emission type, the pixel electrode 191 is transparent, and the common electrode 390 is opaque, thereby transmitting the light to the pixel electrode 191.

In another embodiment, each pixel PX may include more transistors besides a switching transistor Qs and a driving transistor Qd to reduce or compensate degradation of the driving transistor Qd.

Next, an exemplary manufacturing method of the OLED shown in FIGS. 2 and 3 will be described with reference to FIGS. 4 to 13 as well as with reference to FIGS. 2 and 3.

FIGS. 4, 6, 8, 10, 12 and 14 are sectional views of the exemplary OLED sequentially showing an exemplary manufacturing method of the exemplary OLED shown in FIGS. 2 and 3.

Figure 4:
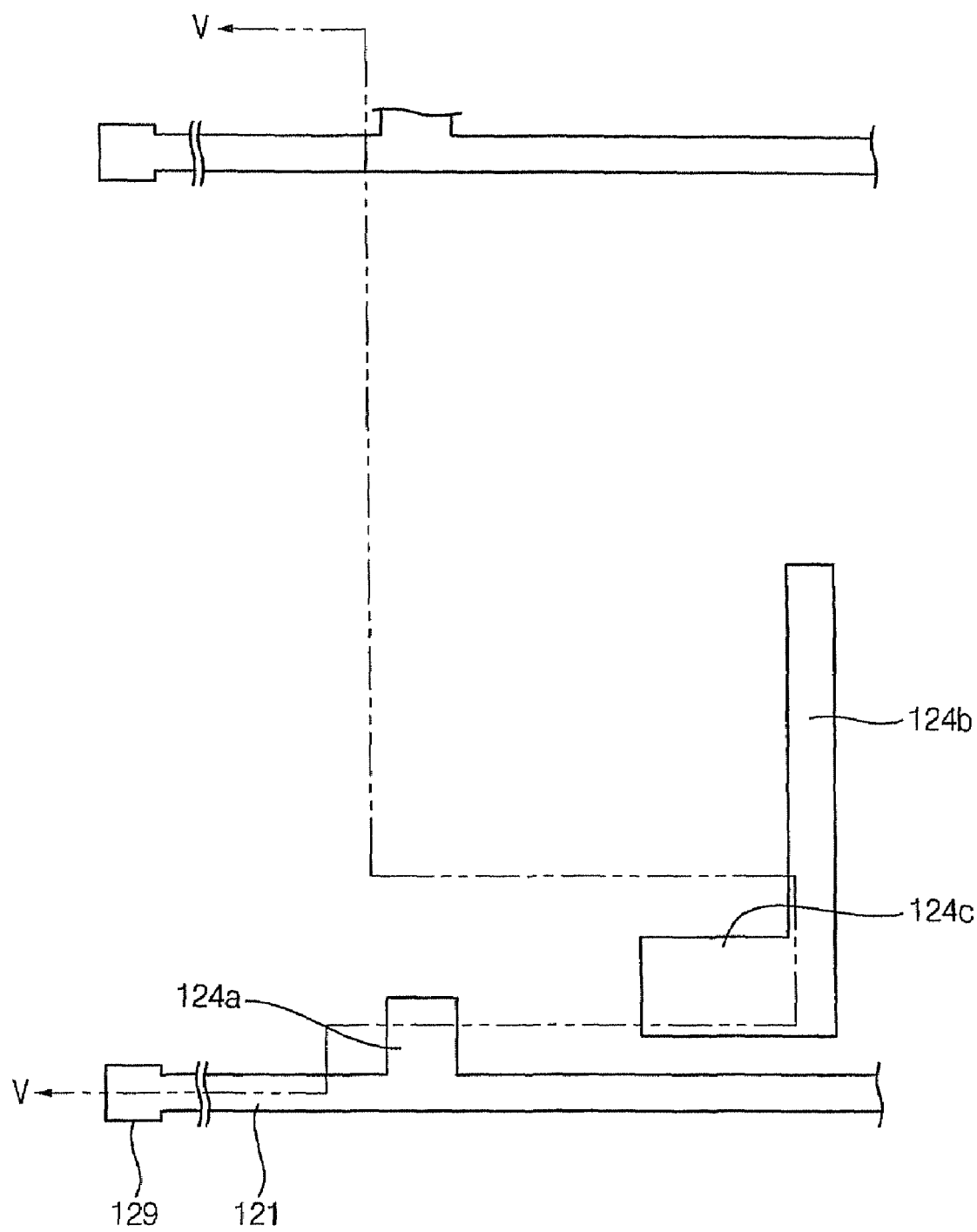
FIGS. 4, 6, 8, 10, 12, and 14 are layout views of the exemplary OLED sequentially showing an exemplary manufacturing method of the exemplary OLED shown in FIGS. 2 and 3.
Figure 5:
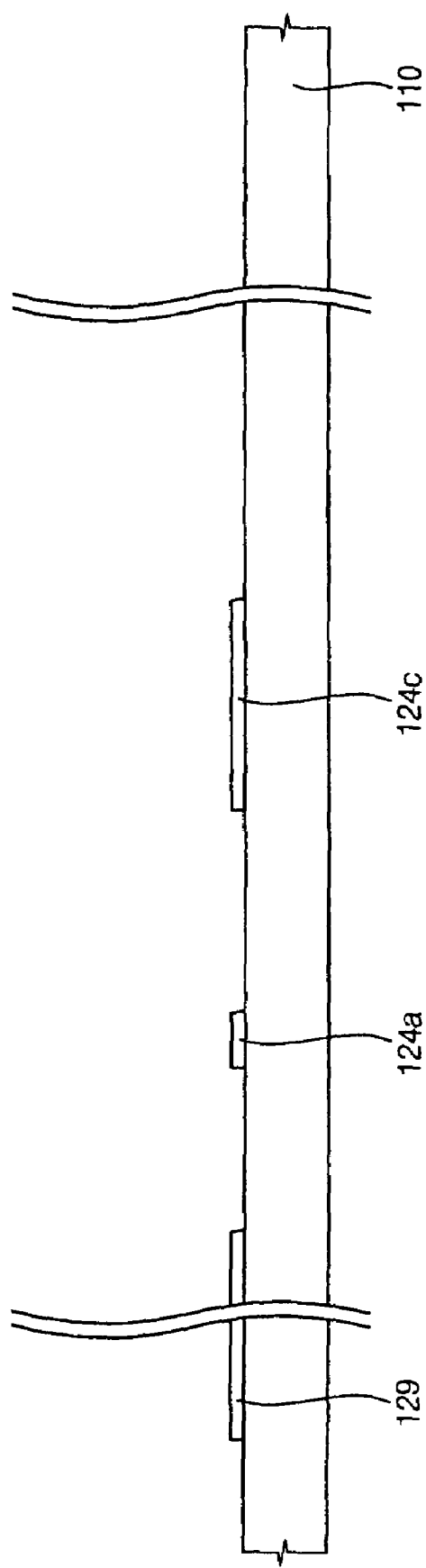
FIG. 5 is a cross-sectional view of the exemplary OLED shown in FIG. 4 taken along line V-V.

FIG. 5 is a cross-sectional view of the exemplary OLED shown in FIG. 4 taken along line IV-IV. Referring to FIGS. 4 and 5, a gate metal (not shown) is deposited on the whole surface of a substrate 110 by chemical vapor deposition (CVD) or sputtering. A plurality of gate lines 121 having an end portion 129, a plurality of first control electrodes 124a, a plurality of second control electrodes 124c, a plurality of storage electrodes 124b are formed by patterning the gate metal.

Figure 6:
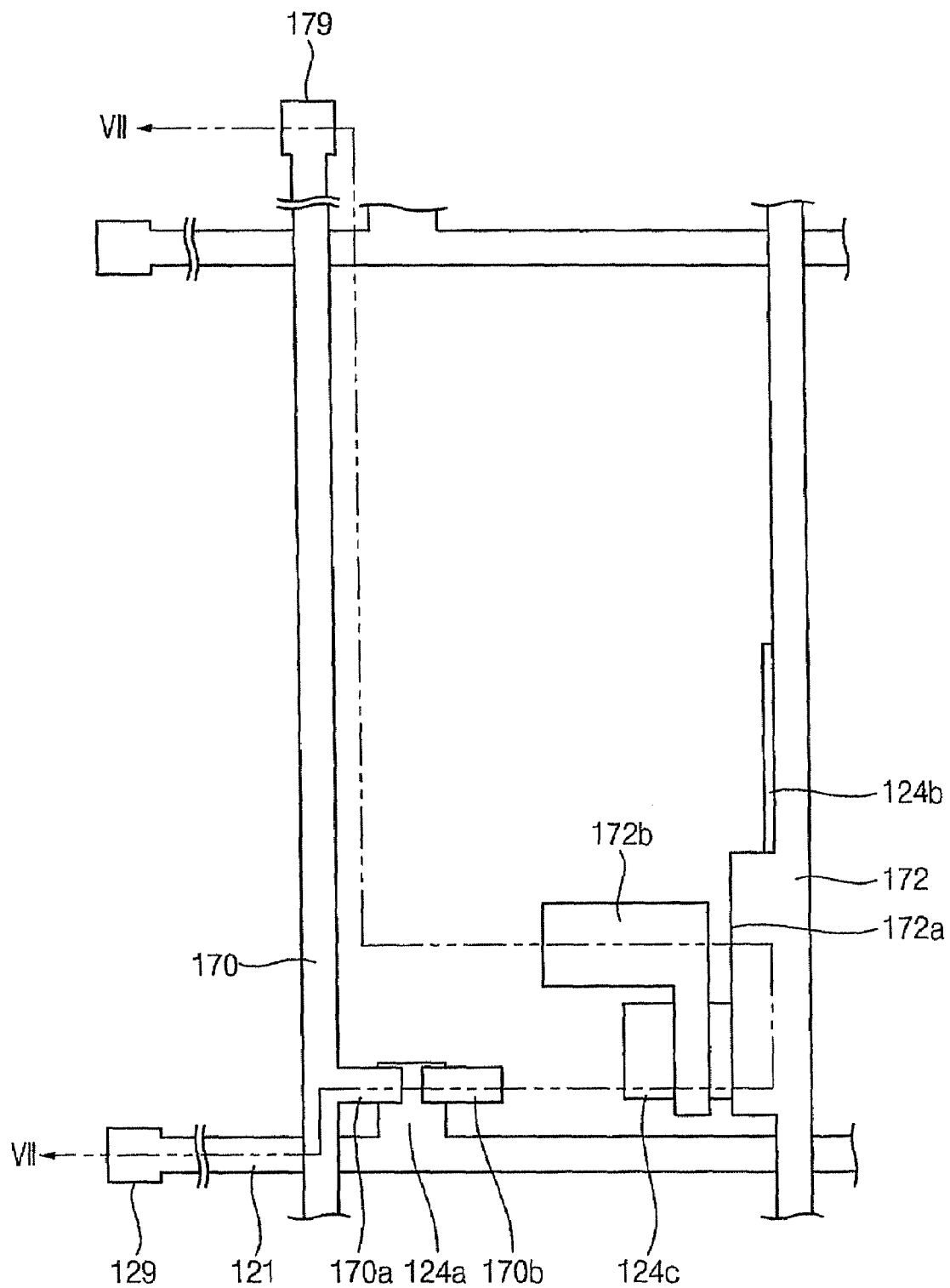
Figure 7:
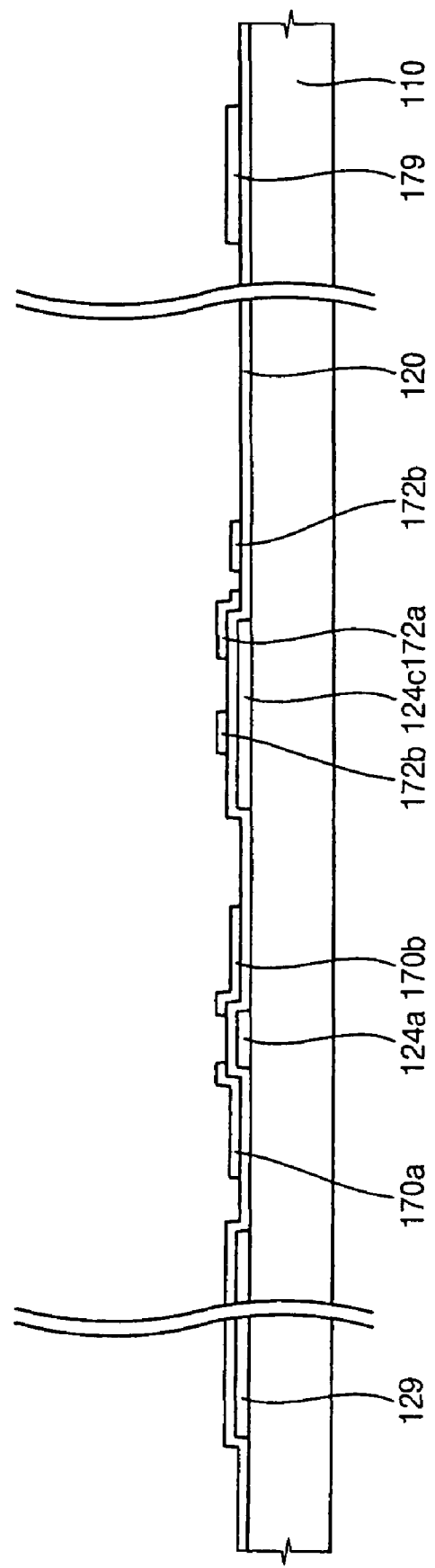
FIG. 7 is a cross-sectional view of the exemplary OLED shown in FIG. 6 taken along line VII-VII.

FIG. 7 is a cross-sectional view of the exemplary OLED shown in FIG. 6 taken along line VI-VI. Referring to FIGS. 6 and 7, an insulating layer 120 made of silicon nitride (SiNx), silicon oxide (SiOx), or high dielectric material such as hafnium oxide (HfO2) is formed on the gate lines 121 and the second control electrodes by CVD or sputtering. A metal film is sequentially formed on the insulating layer 120. Data lines 170, first input electrodes 170a, first output electrodes 170b, driving voltage lines 172, second input electrodes 172a, and second output electrodes 172b are formed by patterning the metal film. A portion of the driving voltage line 172 and the storage electrode 124b form a storage capacitor Cst with the insulating layer 120 therebetween.

Figure 8:
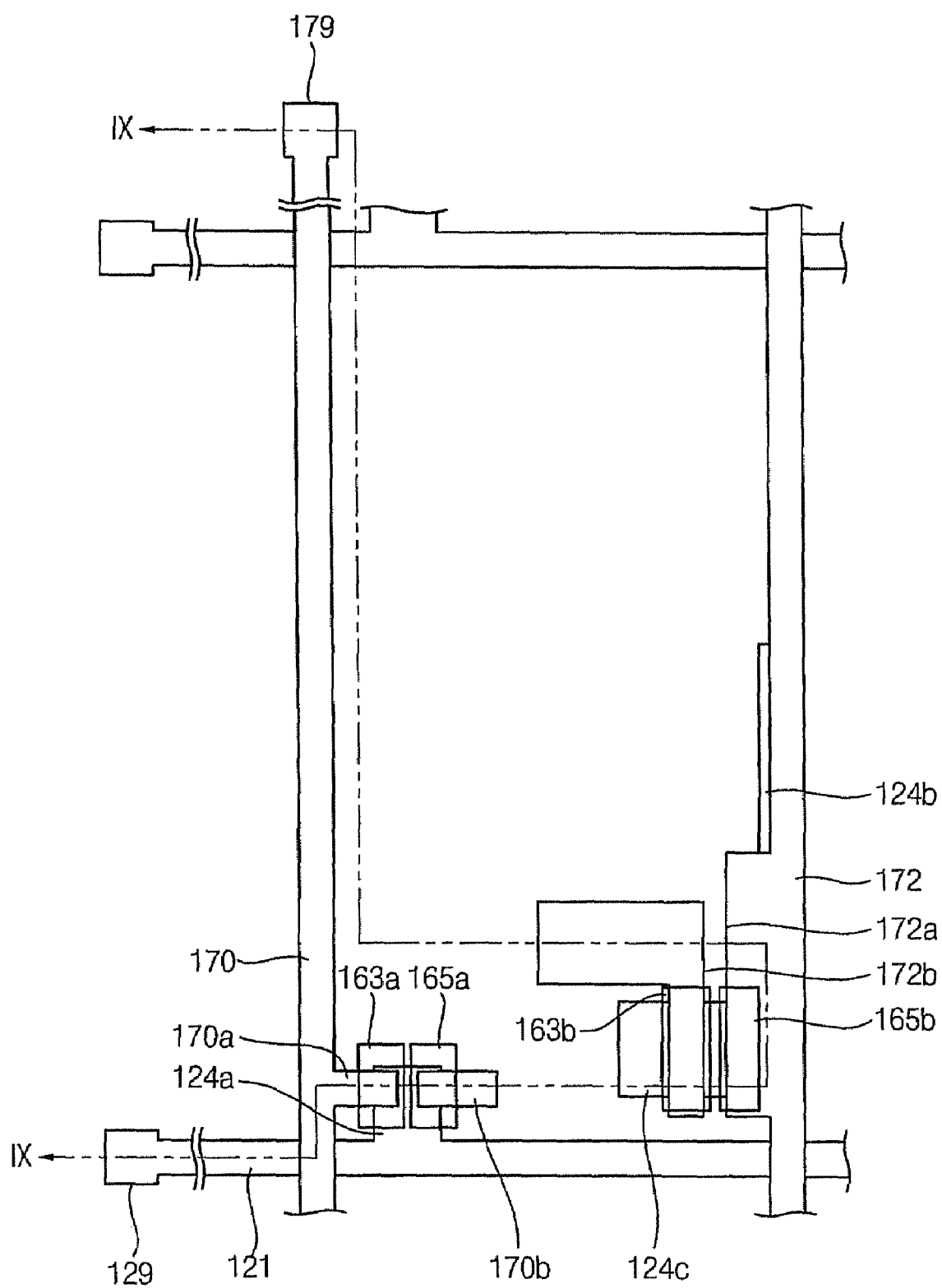
Figure 9:
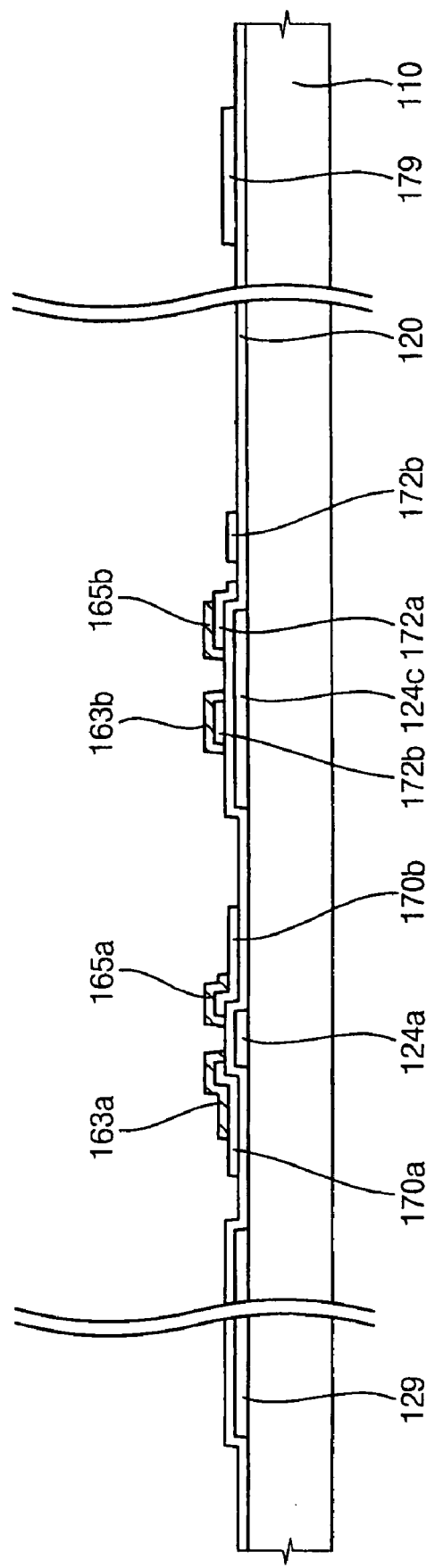
FIG. 9 is a cross-sectional view of the exemplary OLED shown in FIG. 8 taken along line IX-IX.

FIG. 9 is a cross-sectional view of the exemplary OLED shown in FIG. 8 taken along line IX-IX. Referring to FIGS. 8 and 9, an amorphous silicon layer (not shown) doped with impurity is deposited on data lines 170, the first output electrodes 172b, the driving voltage lines 172, and the second output electrodes 172b by CVD or sputtering. Ohmic contact layers 163a, 165a, 163b, and 165b are formed by patterning the amorphous silicon layer. The first ohmic contact layer 163a and the second ohmic contact layer 165a cover the facing sides of the first input electrode 170a and the first output electrode 170b. The third and the fourth ohmic contact layers 163b and 165b cover the facing sides of the second input electrode 172a and the second output electrode 172b.

In another embodiment, the ohmic contact layers 163a, 165a, 163b, and 165b are formed simultaneously with the first input electrode 170a, the first output electrode 170b, the second input electrode 172a and the second output electrodes 172b. Accordingly, the sides of the ohmic contact layers 163a, 165a, 163b, and 165b coincide and have the same shape with the sides of the input electrode 170a, the first output electrode 170b, the second input electrode 172a and the second output electrodes 172b.

Figure 10:
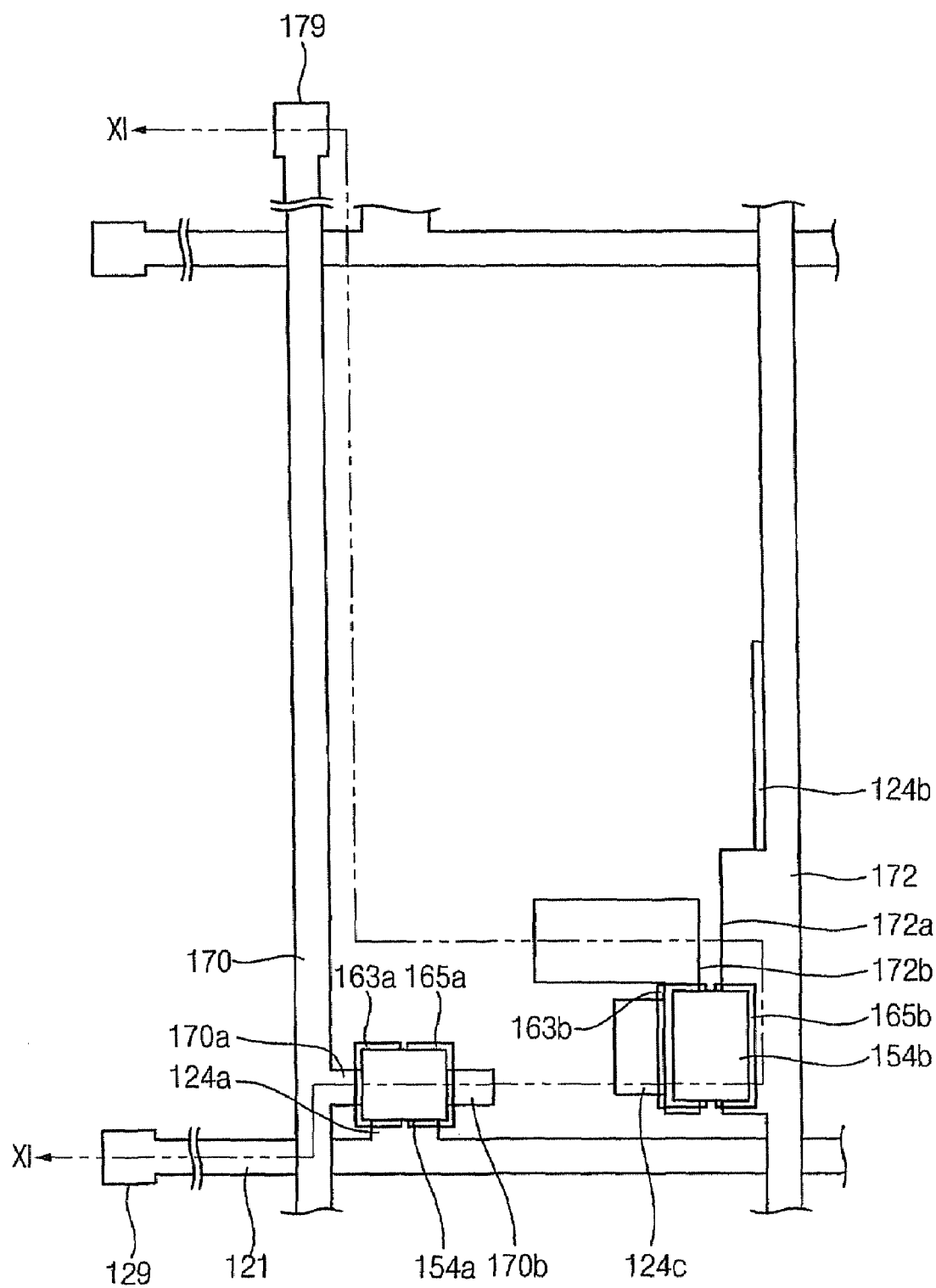
Figure 11:
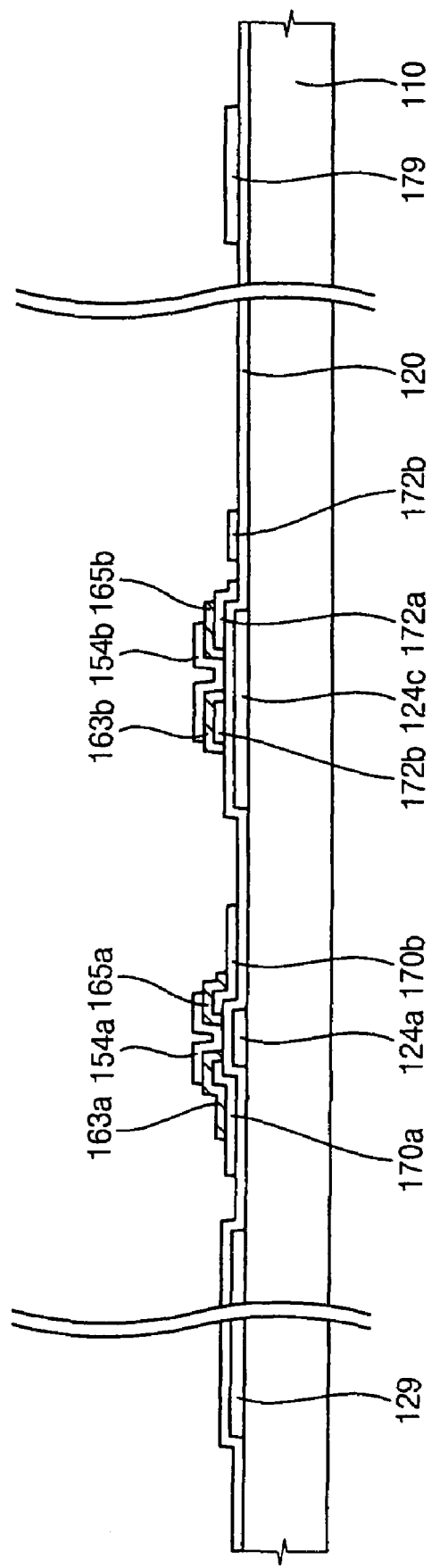
FIG. 11 is a cross-sectional view of the exemplary OLED shown in FIG. 10 taken along line XI-XI.

FIG. 11 is a cross-sectional view of the exemplary OLED shown in FIG. 10 taken along line X-X. Referring to FIGS. 10 and 11, a microcrystalline silicon layer (not shown) is deposited by a CVD and patterned to form first semiconductor layers 154a and second semiconductor layers 154b. In one embodiment, an intrinsic amorphous silicon layer and a metal catalyst layer such as a nickel (Ni) metal can be sequentially deposited by CVD or sputtering and heated at about 500° C., thereby changing the amorphous phase of the silicon into a microcrystalline phase. Thereafter, the microcrystalline silicon layer and the metal catalyst layer can be patterned, and then the metal catalyst layer can be removed to form the first semiconductor layer 154a and the second semiconductor layer 154b. The metal catalyst can improve the crystallizing rate of the amorphous silicon. The grain sizer of microcrystalline silicon is less than about $10^{-6m}$. The grain size of polycrystalline silicon is bigger than about $10^{-6m}$. In another embodiment, an intrinsic amorphous silicon layer can be deposited and patterned to form the first semiconductor layer and the second semiconductor layer.

Figure 12:
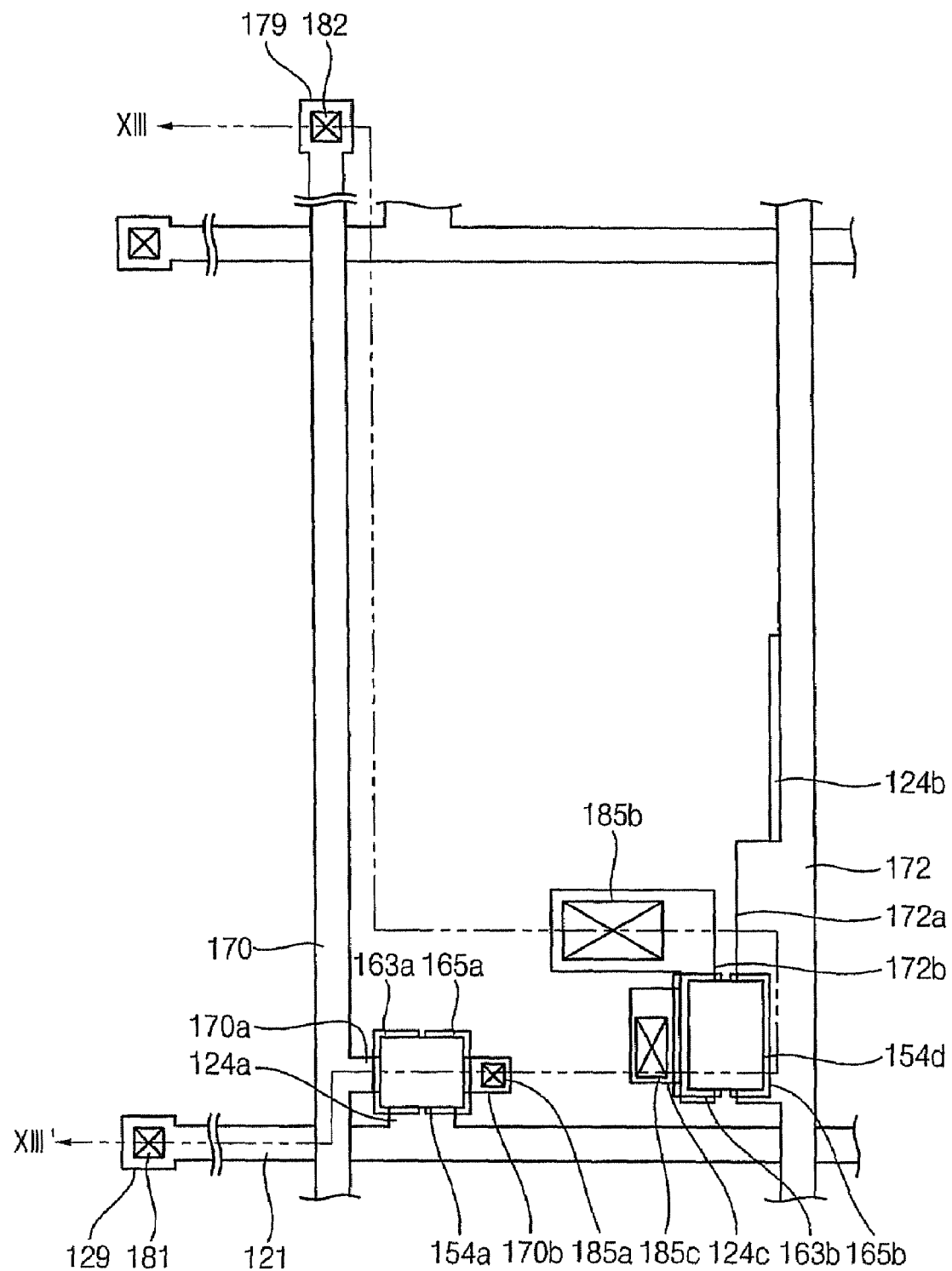
Figure 13:
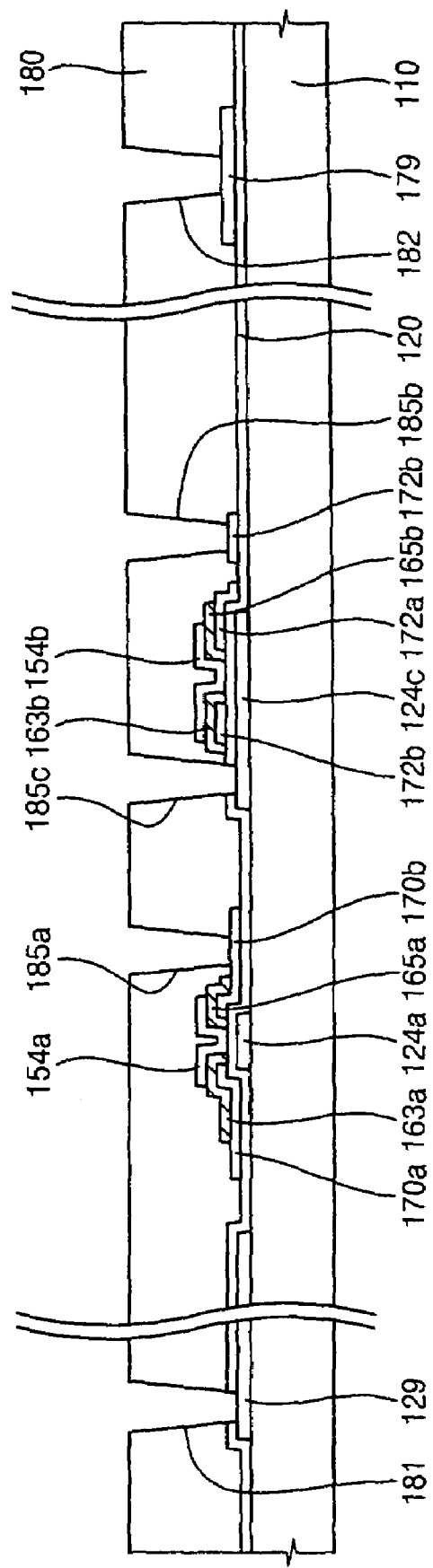
FIG. 13 is a cross-sectional view of the exemplary OLED shown in FIG. 12 taken along line XIII-XIII.

FIG. 13 is a cross-sectional view of the exemplary OLED shown in FIG. 12 taken along line XIII-XIII. Referring to FIGS. 12 and 13, a passivation layer 180 is deposited on the insulating layer 120, the first semiconductor layers 154a, and the second semiconductor layers 154b by CVD. The passivation layer 180 is patterned to form contact holes 185a exposing the portions of the first input electrode 170b, contact holes 185b exposing the portions of the second output electrodes 172a, and contact holes 182 exposing the portions of the end portions 179 of the data lines 170. The passivation layer 180 and the insulating layer 120 are patterned to form contact holes 181 exposing the portions of the end portions 129 of the gate lines 121 and contact holes 185c exposing the portions of the second control electrode 124c.

Figure 14:
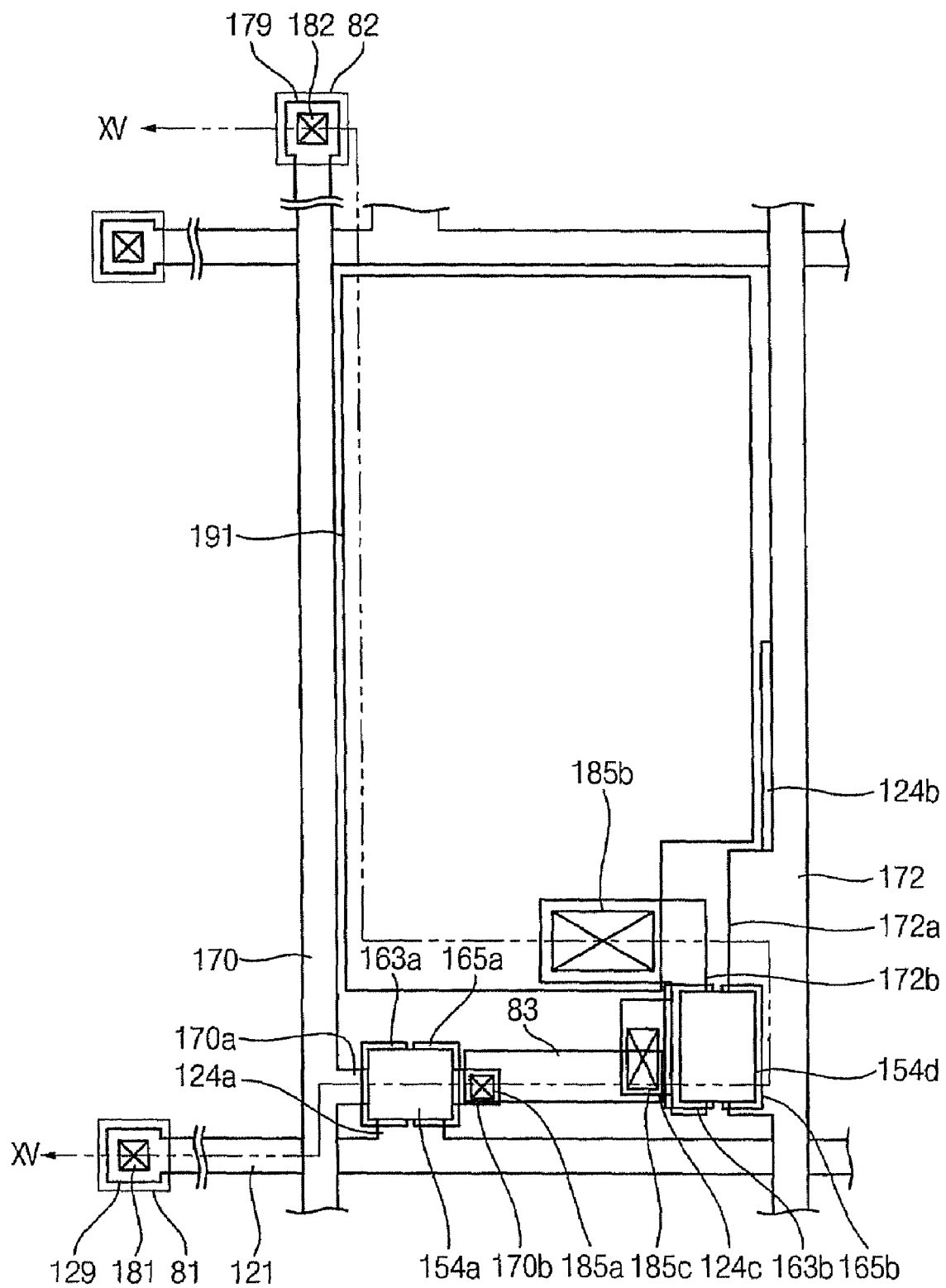
Figure 15:
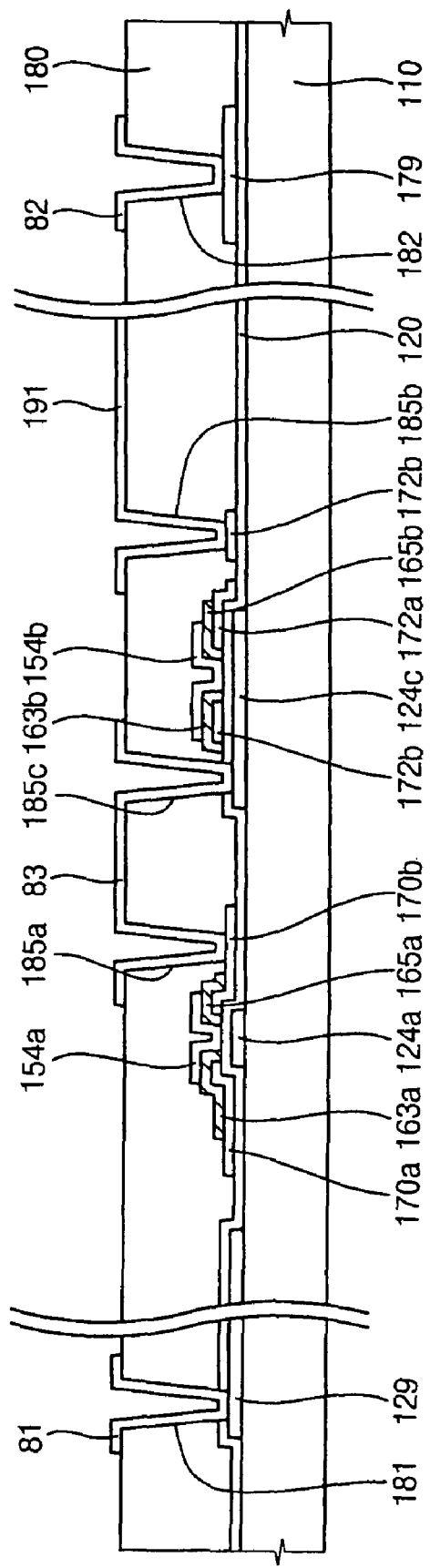
FIG. 15 is a cross-sectional view of the exemplary OLED shown in FIG. 14 taken along line XV-XV; and, FIG. 16 is a cross-sectional view of an exemplary OLED according to another embodiment of the present invention.

FIG. 15 is a cross-sectional view of the exemplary OLED shown in FIG. 14 taken along line XIV-XIV. Referring to FIGS. 14 and 15, a transparent conductive layer such as indium tin oxide (ITO) and indium zinc oxide (IZO) is deposited on the passivation layer 180 by sputtering. A plurality of pixel electrodes 191, a plurality of connection members 83, and a plurality of contact assistants 81 and 82 are formed by patterning the transparent conductive layer.

Each pixel electrode 191 is connected to the associated second output electrode 172b through the contact hole 185b. The connection member 3 connects the first output electrode 170b and the second control electrode 124c through the contact holes 185a and 185c.

Next, further referring to FIGS. 2 and 3, a partition 361 having a plurality of openings 365 is formed. Thereafter, organic light emitting members 370 are formed in the openings 365 and a common electrode is formed on the whole surface of the partition 361 and the organic light emitting members 370.

Figure 16:
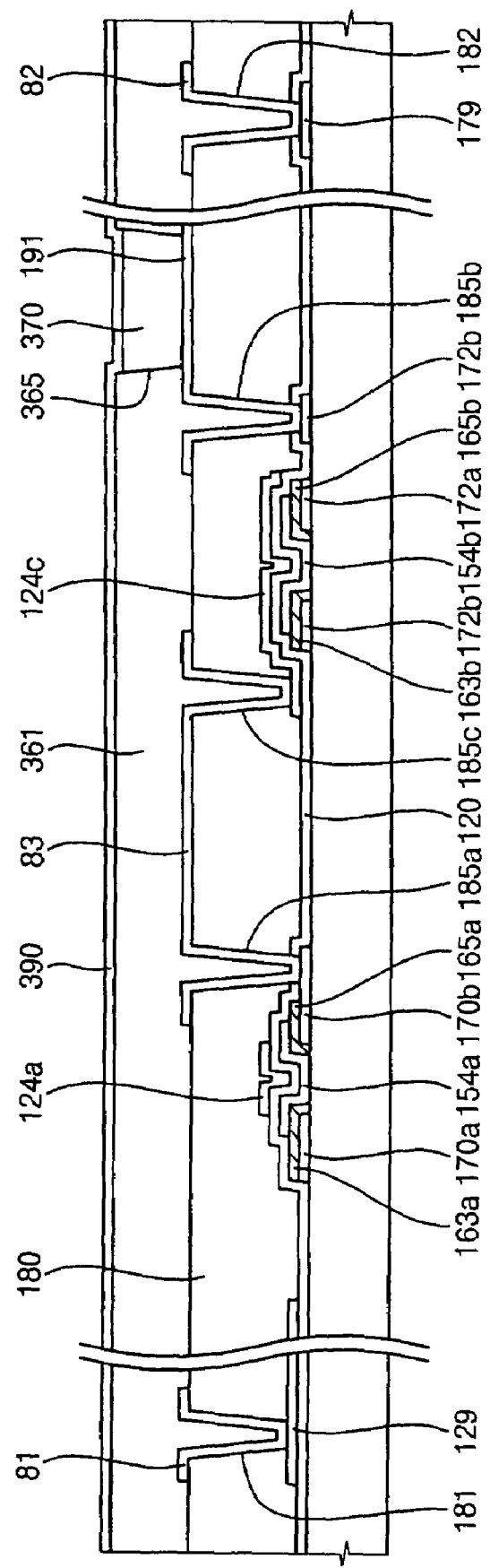

FIG. 16 is a cross-sectional view of an OLED according to another exemplary embodiment of the present invention. Elements in FIGS. 2 and 3 are identical to elements shown in FIG. 16 except that control electrodes are disposed on the input electrodes, the output electrodes and the insulating layer. A duplicated explanation will be skipped.

Referring to FIG. 16, a plurality of first input electrodes 170a, a plurality of first output electrodes 170b, a plurality of second input electrodes 172a, and a plurality of second output electrodes 172b are formed on a substrate 110.

First, second, third, and fourth ohmic contacts 163a, 165a, 163b, and 165b are formed on the first input electrodes 170a, the first output electrodes 170b, the second input electrodes 172a, and the second output electrodes 172b respectively.

The first and the second ohmic contacts 163a and 165a cover the opposite side surface of the first input electrode 170a and the first output electrodes 170b.

The third and the fourth ohmic contacts 163b and 165b cover the opposite side surfaces of the second input electrodes 172a and the second output electrodes 172b.

A first semiconductor layer 154a and a second semiconductor layer 154b are formed on the first, the second, the third, and the fourth ohmic contacts 163a, 165a, 163b, and 165b and the substrate 110 between the ohmic contacts. That is, the first semiconductor layer 154a is formed to fill between the first and the second ohmic contacts 163a and 165a. The second semiconductor layer 154b is formed to fill between the third and the fourth ohmic contacts 163b and 165b.

An insulating layer 120 is formed on the substrate 110, the first semiconductor layer 154a, and the second semiconductor layer 154b.

A plurality of first control electrodes 124a and a plurality of second control electrodes 124c are formed on the insulating layer 120.

A passivation layer 180 is formed on the first and the second control electrodes 124a and 124b.

The passivation layer 180 has a plurality of contact holes 181 to expose the end portion 129 of the gate lines 121 of FIG. 2 and a plurality of contact holes 185c to expose the second control electrodes 124c. The passivation layer 180 and the insulating layer 120 have a plurality of contact holes 182 to expose the end portion 170 of the data lines 170 of FIG. 2 and a plurality of contact holes 185a and 185b to expose the first output electrodes 170b and the second output electrodes 172b.

A plurality of pixel electrodes 191, a plurality of connection members 83 and a plurality of contact assistants 81 and 82 are formed on the passivation layer.

A partition 361 is formed on the pixel electrodes 191, the connection members 83, the contact assistants 81 and 82, and the exposed surface of the passivation layer 180.

A plurality of organic light emitting members 370 are formed on the pixel electrode 191 and confined in the opening 365 defined by the partition 361.

A common electrode 370 is formed on the organic light emitting member 370 and the partition 361.

According to the present invention, the semiconductor layers are formed after the ohmic contacts are formed, thereby reducing non-uniformity of the thickness of the semiconductor layer and the damage of the semiconductor layer caused during the formation of the ohmic contact layer.

Also, the ohmic contact layer covers the opposite side surfaces of the input electrode and the output electrode to prevent the input and the output electrodes from contacting directly to the semiconductor layer, thereby reducing off current of the transistor.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. An organic light emitting device comprising:
   a substrate;
   a driving transistor comprising:
      a first control electrode formed on the substrate;
      an insulating layer formed on the first control electrode and the substrate;
      a first electrode and a second electrode spaced apart from each other with respect to the first control electrode and formed on the insulating layer;
      a first ohmic contact layer and a second ohmic contact layer formed on the first electrode and the second electrode; and
      a first semiconductor layer formed on the first ohmic contact layer and the second ohmic contact layer to fill the first electrode and the second electrode;
   a pixel electrode connected to the second electrode;
   an organic light emitting member formed on the pixel electrode;
   a counter electrode formed on the organic light emitting member; and
   a switching transistor electrically connected to the first control electrode,
   wherein the switching transistor comprises:

a second control electrode connected to a gate line, a second semiconductor layer formed in the area corresponding to the second control electrode;

a third electrode connected to a data line and a fourth electrode electrically connected to the second semiconductor layer;

a third ohmic contact layer formed between the third electrode and the second semiconductor layer; and a fourth ohmic contact layer formed between the fourth electrode and the second semiconductor layer.

2. The organic light emitting device of claim 1, wherein the second control electrode is formed of the same layer with the first control electrode.

3. The organic light emitting device of claim 1, wherein the third electrode and the fourth electrode are formed of the same layer with the first electrode and the second electrode.

4. The organic light emitting device of claim 3, wherein the second semiconductor layer is formed of the same layer with the first semiconductor layer.

5. The organic light emitting device of claim 4, wherein the third ohmic contact layer and the fourth ohmic contact layer are formed of the same layer with the first ohmic contact layer and the second ohmic contact layer.

6. The organic light emitting device of claim 1, wherein the third ohmic contact layer and the fourth ohmic contact layer covers the opposite side surfaces of the third electrode and the fourth electrode.

7. The organic light emitting device of claim 1, wherein the second semiconductor layer comprises amorphous silicon, microcrystalline silicon, or polysilicon.

8. The organic light emitting device of claim 1, wherein the third ohmic contact layer and the fourth ohmic contact layer have the same shape with the third electrode and the fourth electrode.

9. The organic light emitting display of claim 1, wherein the first ohmic contact layer and the second ohmic contact layer have the same shape with the first electrode and the second electrode.

10. The organic light emitting device of claim 1, wherein the first semiconductor layer comprises amorphous silicon, microcrystalline silicon, or polysilicon.

11. The organic light emitting device of claim 1, wherein the first ohmic contact layer and the second ohmic contact layer cover the opposite side surfaces of the first electrode and the second electrode.

* * * * *